US009214561B2

(12) United States Patent
Abou-Khalil et al.

(10) Patent No.: US 9,214,561 B2
(45) Date of Patent: Dec. 15, 2015

(54) THIN BODY SWITCH TRANSISTOR

(71) Applicant: INTERNATIONAL BUSINESS MACHINES CORPORATION, Armonk, NY (US)

(72) Inventors: Michel J. Abou-Khalil, Essex Junction, VT (US); Alan B. Botula, Essex Junction, VT (US); Mark D. Jaffe, Shelburne, VT (US); Alvin J. Joseph, Williston, VT (US); James A. Slinkman, Montpelier, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 5 days.

(21) Appl. No.: 13/929,256

(22) Filed: Jun. 27, 2013

(65) Prior Publication Data
US 2015/0001622 A1 Jan. 1, 2015

(51) Int. Cl.
H01L 21/336 (2006.01)
H01L 21/3205 (2006.01)
H01L 21/4763 (2006.01)
H01L 29/786 (2006.01)
H01L 21/28 (2006.01)
H01L 21/84 (2006.01)
H01L 29/66 (2006.01)

(52) U.S. Cl.
CPC .... *H01L 29/78654* (2013.01); *H01L 21/28123* (2013.01); *H01L 21/84* (2013.01); *H01L 29/66613* (2013.01)

(58) Field of Classification Search
CPC .................. H01L 29/66772; H01L 29/78696; H01L 29/66613
USPC .................... 438/589, 270; 257/647
See application file for complete search history.

(56) References Cited

U.S. PATENT DOCUMENTS

| 5,047,356 | A |   | 9/1991  | Li et al. |
| 5,439,836 | A | * | 8/1995  | Giffard ......................... 438/151 |
| 5,489,792 | A | * | 2/1996  | Hu et al. ....................... 257/347 |
| 5,552,329 | A | * | 9/1996  | Kim et al. ..................... 438/291 |
| 6,010,921 | A | * | 1/2000  | Soutome ....................... 438/151 |
| 6,121,077 | A | * | 9/2000  | Hu et al. ....................... 438/164 |
| 6,177,708 | B1| * | 1/2001  | Kuang et al. .................. 257/347 |
| 6,509,234 | B1| * | 1/2003  | Krivokapic ................... 438/270 |
| 6,656,810 | B1| * | 12/2003 | Fukushima ................... 438/320 |
| 7,141,459 | B2|   | 11/2006 | Yang et al. |

* cited by examiner

Primary Examiner — Mary Wilczewski
Assistant Examiner — Erik T Peterson
(74) Attorney, Agent, or Firm — Michael J. LeStrange; Andrew M. Calderon; Robert Mlotkowski Safran & Cole, P.C.

(57) ABSTRACT

An integrated recessed thin body field effect transistor (FET) and methods of manufacture are disclosed. The method includes recessing a portion of a semiconductor material. The method further includes forming at least one gate structure within the recessed portion of the semiconductor material.

17 Claims, 4 Drawing Sheets

THIN BODY SWITCH TRANSISTOR

FIELD OF THE INVENTION

The invention relates to semiconductor structures and, more particularly, to an integrated recessed thin body field effect transistor (FET) and methods of manufacture.

BACKGROUND

Integrated circuits are used in many applications including cellular telephones, computers and a host of other electronic devices. In cellular telephone applications, for example, the integrated circuits and more particularly field effect transistors (FET) are used as switches. These switches require high switching speeds, with reduced Coff characteristics. As these FET switches continue to scale downward in size, there is a need to also maintain and even increase their performance, while maintaining low-power requirements.

The switching speeds of FET devices are determined by the time required for the charge carriers to travel across the semiconductor region, e.g., channel region. Typical values in power devices are approximately 20 to 200 picoseconds depending on the size of the device. However, in known FET applications, as the voltage increases across the body or gate, itself, the Coff also significantly increases, thus degrading performance, e.g., slowing switching speeds and RF power handling.

Accordingly, there exists a need in the art to overcome the deficiencies and limitations described hereinabove.

SUMMARY

In an aspect of the invention, a method comprises recessing a portion of a semiconductor material. The method further comprises forming at least one gate structure within the recessed portion of the semiconductor material.

In an aspect of the invention, a method comprises exposing a surface of a silicon on insulator (SOI) material. The method further comprises performing an oxidation process on the exposed surface of the SOI material to form an oxide region within the SOI material. The method further comprises removing the oxide region to form a thinned SOI region of the SOI material. The method further comprises forming a gate structure on the thinned SOI region of the SOI material.

In an additional aspect of the invention, a structure comprises a recessed Si region surrounded by a thicker Si region. The structure further comprises a gate crossing multiple Si regions including the recessed Si region and the thicker Si region. The structure further comprises a body contact region on the thicker Si region. The structure further comprises a channel on both the recessed Si region, forming a thinner region, and the thicker Si region.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to an integrated recessed thin body FET and methods of manufacture. More specifically, the structure of the present invention is an nFET formed in a recessed portion of silicon on insulator (SOI) to form a thin body SOI nFET. In embodiments, the thin body SOI nFET can be integrated into existing technologies, e.g., Si thickness of 1400 Å to 1600 Å. In more specific embodiments, the thin body SOI nFET can have a Si thickness (Tsi) of about 1000 Å or less. The minimum achievable thickness is limited by oxidation furnace control and the mechanical stress state in the resultant thin body.

Advantageously, implementing the FET with an ultra-thin body provides a fully depleted SOI region which, in turn, results in faster switching speeds. Also, the FET of the present invention provides improved isolation, Coff and Coff(V), compared to conventional thicker SOI devices. In addition, RF power handling for the thin-body FET of the present invention is superior by more than 3 dB, compared to conventional thicker SOI devices. The Thin body structure improves the standard switching performance metric, "Ron Coff".

FIGS. 1-7 show structures and respective processing steps in accordance with aspects of the present invention. It should be understood by those of skill in the art that the processes of manufacturing the FET of the present invention and other components can be manufactured in a number of ways using a number of different tools. In general, though, the methodologies and tools are adopted from integrated circuit (IC) technology to form the structures with specific dimensions. For example, the structures of the present invention, e.g., thin body FET, spacers, dielectric materials, etc., are built on wafers and are realized in films of materials patterned by photolithographic processes. In particular, the fabrication of the structures uses three basic building blocks: (i) deposition of films of material on a substrate, (ii) applying a patterned mask on top of the films by photolithographic imaging, and (iii) etching the films selectively to the mask.

Figure 1:
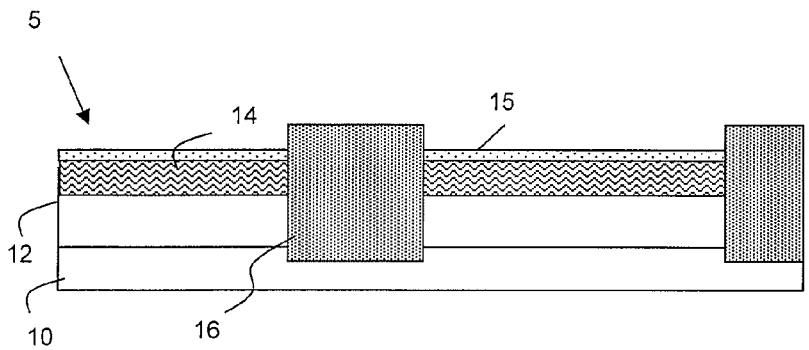
FIGS. 1-7 show structures and respective processing steps in accordance with aspects of the present invention.

More specifically, as shown in FIG. 1, the structure 5 of the present invention includes a substrate 10. In embodiments, the substrate 10 can be any layer of a device, composed of an oxide or other material known to those of skill in the art. As should be understood by those of skill in the art, the substrate 10 can be implemented in an SOI wafer implementation, as an example. In this implementation, the substrate 10 can be, for example, a high resistivity Si material, Si handle wafer or an insulating substrate, e.g., oxide.

Still referring to FIG. 1, the constituent materials of the SOI wafer implementation may be selected based on the desired end use application of the semiconductor device. For example, an insulation layer 12, e.g., BOX, bonded to the substrate 10, may be composed of oxide, such as $SiO_2$. Moreover, an active semiconductor layer 14 can be comprised of various semiconductor materials, such as, for example, Si or other Si based material such as SiGe. In embodiments, the thickness of the semiconductor layer 14 can be about 1400 Å to about 1600 Å, and preferably about or above 1450 Å, i.e., a thick Si layer.

In embodiments, an oxide or other insulator layer 15 is formed on the semiconductor layer 14, preferably using a conventional deposition process, e.g., chemical vapor deposition (CVD). Shallow trench isolation (STI) structures 16 are formed through the insulator layer 15, semiconductor layer 14, insulation layer 12 and, in embodiments, to the substrate 10. In embodiments, the STI structures 16 can be slightly raised or planar with the semiconductor layer 14, depending on the fabrication processes.

In embodiments, to form the STI structures 16, a resist can be formed over the insulator layer 15 and exposed to energy (light) to form a pattern. An etching process, e.g., reactive ion etching (RIE), can be performed through the patterned resist to form trenches within the layers of the structure. The resist is then removed using a conventional oxygen ashing process, for example. The trenches are filled with an oxide or other insulator material to form the STI structures 16. The oxide material can be planarized using, for example, a chemical mechanical polishing (CMP) process, known to those of skill in the art. To form raised STI structures 16, a nitride or other hardmask material can be formed over the insulator layer 15, prior to forming the resist, and then later stripped, leaving raised STI structures 16.

Figure 2:
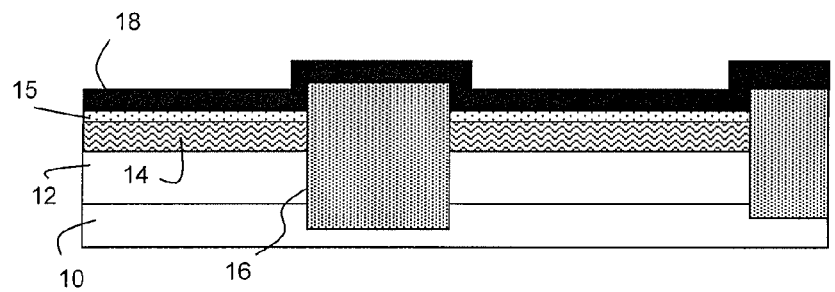

In FIG. 2, a hardmask material 18, e.g., nitride, is formed over the semiconductor layer 14 and the STI structures 16, and preferably directly on the insulator layer 15. In embodiments, the hardmask material 18 can be blanket deposited on the insulator layer 15 and the STI structures 16 using conventional deposition methods, e.g., CVD processes. In embodiments, the hardmask material 18 can be patterned using conventional photolithographic and etching processes, known to those of skill in the art.

Figure 3:
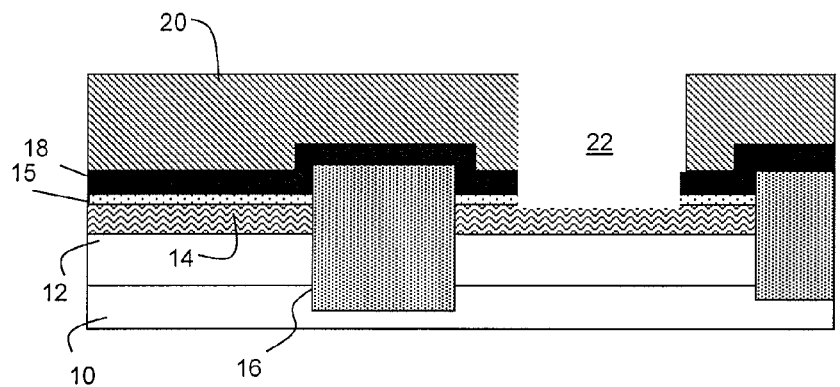

FIG. 3 shows additional processing steps and a respective structure in accordance with aspects of the present invention. Specifically, in FIG. 3, a resist 20 is formed over the hardmask material 18 and exposed to energy (light) to form a pattern. An etching process, e.g., reactive ion etching (RIE), can be performed through the patterned resist to form an opening 22 within layers of the structure, e.g., insulator layer 15 and hardmask material 18. In this way, the underlying semiconductor layer 14 is exposed. The resist is then removed using a conventional oxygen ashing process, for example.

Figure 4:
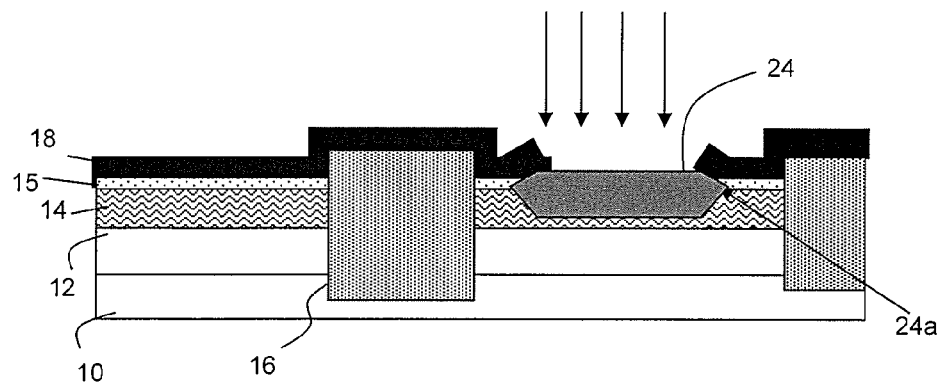

In FIG. 4, the exposed semiconductor layer 14 undergoes an oxidation process to form oxidized region 24. More specifically, the semiconductor layer 14 undergoes a high temperature, e.g., about 1450° C. oxidation process to form the oxidized region 24. During this process, the hardmask material 18 protects remaining portions, e.g., thick portions 14a, of the semiconductor layer 14 from oxidizing. In embodiments, the oxidized region 24 can be about 1000 Å in thickness; although, other dimensions are also contemplated by the present invention. In embodiments, the oxidized region 24 can be about 300 Å or more below the surface of the semiconductor layer 14; although, other dimensions are also contemplated by the present invention, in order to reduce the overall thickness of the semiconductor layer 14 as described herein. In embodiments, the oxidized region 24 includes bird's beaks 24a, and may also slightly raise the hardmask material 18. In embodiments, the slope of the bevel edges forming the bird's beaks 24a can have a ratio of about 3:1, for example.

Figure 5:
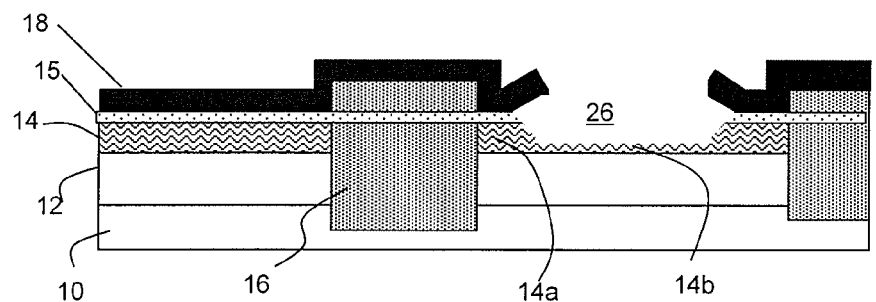

In FIG. 5, the oxidized region 24 is removed using, for example, an HF wet etch process. In embodiments, the wet etch process will remove the oxidized region 24, leaving a recessed portion 26. In embodiments, the removal of the oxidized region 24 thins the underlying semiconductor layer 14 to about, for example, 500 Å. In embodiments, the present invention contemplates thinning the underlying semiconductor layer 14 to other thicknesses ranging from, for example, 300 Å to 1100 Å and preferably, 300 Å to 1100 Å, and preferably less than 1000 Å. In further preferred embodiments, the ratio of the thick portion 14a of the semiconductor layer 14 to the thin portion 14b of the semiconductor layer 14 can be about 4 to 1. In this way, it is possible to make the underlying semiconductor layer 14 thinned and fully depleted.

Figure 6:
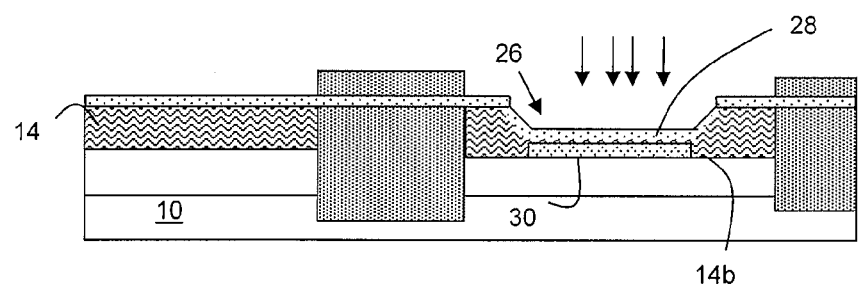

FIG. 6 shows additional processing steps and a respective structure in accordance with aspects of the present invention. Specifically, in FIG. 6, a pad oxide 28 can be formed on the exposed semiconductor layer 14, within the recessed portion 26. In embodiments, the pad oxide 28 can be about 80 Å, which undergoes a deglazing process to remove any oxynitride material, e.g., removal of about 15 Å. The hardmask material is removed, and the recessed portion 26 undergoes a dopant implant process to form a well implant 30. For example, for an nFET device, a p-type dopant, e.g., boron, will be implanted into the thinned underlying semiconductor layer 14b. Alternatively, for a pFET, an n-type dopant, e.g., arsenic, will be implanted into the thinned underlying semiconductor layer 14b.

Figure 7:
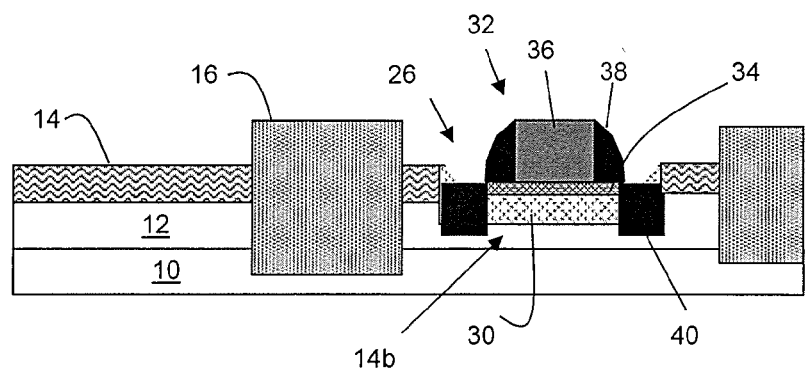

FIG. 7 shows additional processing steps and a respective structure in accordance with aspects of the present invention. Specifically, in FIG. 7, the pad oxide and other insulator layer (e.g., insulator layer 15) can be removed and a gate structure 32 formed within the recessed portion 26, e.g., on the thinned underlying semiconductor layer 14b. In particular, the gate structure 32 includes a dielectric material 34 formed on the thinned underlying semiconductor layer 14b (on the well implanted region 30). In embodiments, the dielectric material 34 can be an oxide material or high-k dielectric material, e.g., hafnium based material, formed using conventional deposition processes, e.g., CVD. In embodiments, the dielectric material 34 can have a thickness of about 50 Å to about 120 Å. Gate material 36, e.g., polysilicon or one or more layers of metal, can be deposited and patterned onto the dielectric material 34 using conventional deposition, photolithographic and etching processes as described herein.

Still referring to FIG. 7, sidewall spacers 38 are formed on the gate material 36, using conventional deposition processes. In embodiments, the sidewall spacers 38 can be nitride or oxide, as examples. A thick gate oxide and sidewall oxide (or nitride) spacers can be used to improve gate-drain fields. Source and drain regions, halo implants and/or extension regions (all represented at reference numeral 40) can be formed using conventional back end of the line (BEOL) processes. Silicide and other contact formation processes can also be performed using conventionally well known BEOL processes. These features can also be represented at reference numeral 40.

Figure 8:
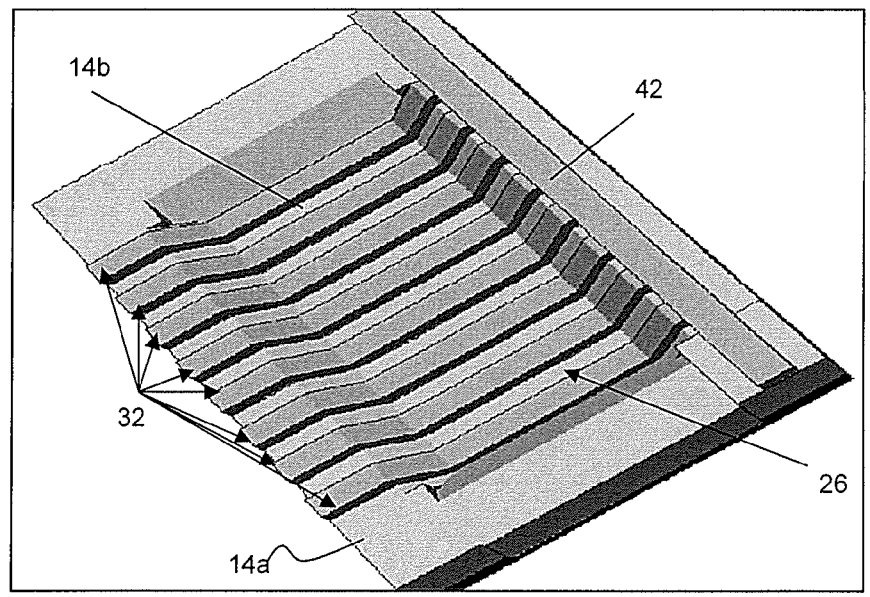
FIG. 8 shows a top perspective view of the structure in accordance with aspects of the present invention.

FIG. 8 shows a top perspective view of the structure in accordance with aspects of the present invention. As shown in this top perspective view, a plurality of gate structures 32 span between opposing thick portions 14a of the semiconductor layer 14 and within the recessed portion 26, e.g., the thin portion 14b of the semiconductor layer 14. In this way, a multi-finger FET device can be formed. In embodiments, the gate structures 32 (e.g., poly or metal material) can have a length of approximately 0.15 microns to about 0.50 microns and more preferably about 0.24 microns, and a spacing therebetween of about 0.4 microns to about 0.6 microns. Also, as shown in this view, the plurality of the gate structures 32 are surrounded by the thick portions 14a (which forms a ring (completely bounds) structure of semiconductor material 14). Also, each of the plurality of the gate structures 32 can be contacted to a body contact 42 on the thick portion 14a. The channel of the gate structures 32 can be formed on both the thick portions 14a and the thin portion 14b.

Figure 9:
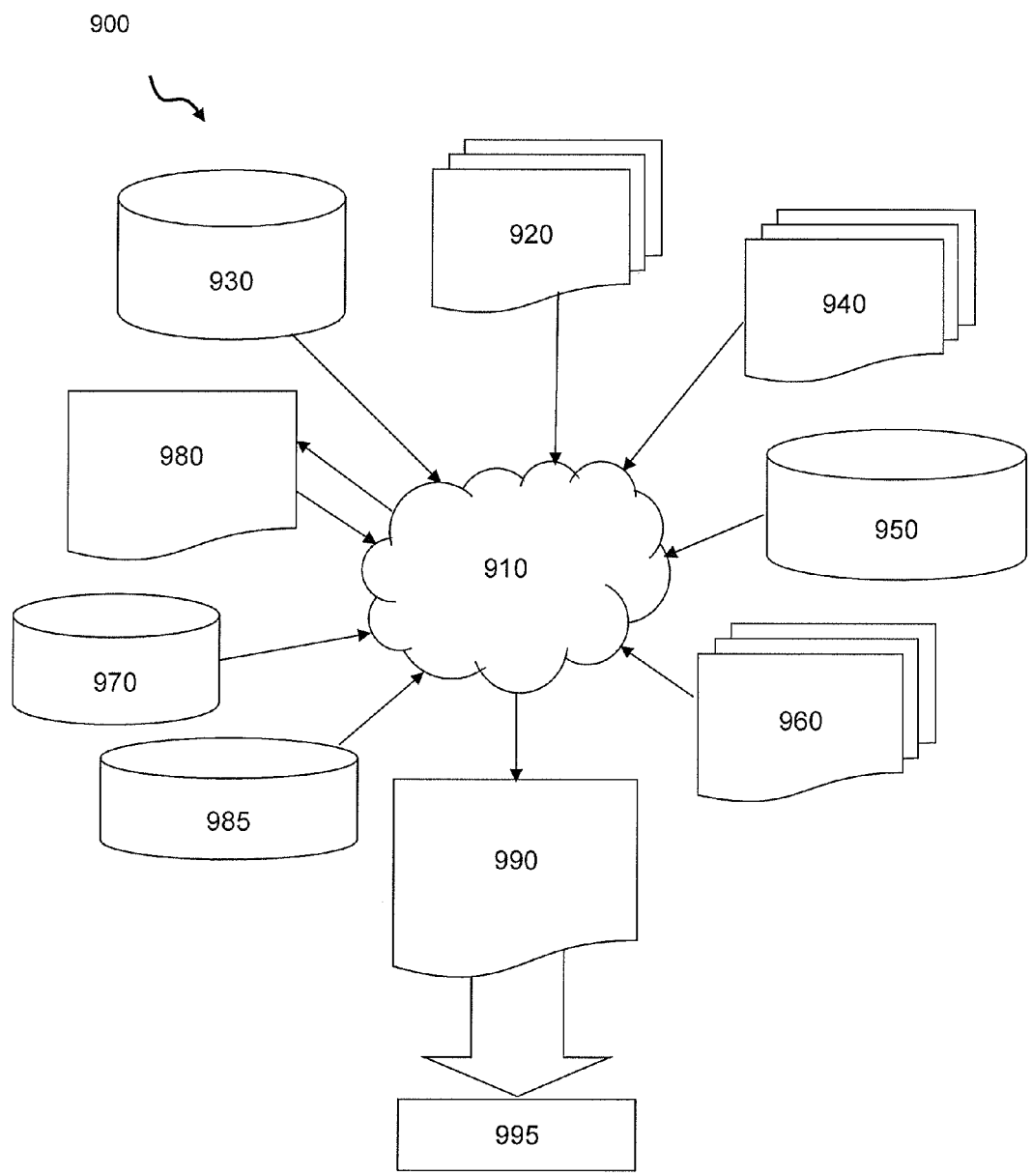
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   etching portions of an insulator material formed on semiconductor material to expose a surface of the semiconductor material;
   recessing a portion of the semiconductor material via an oxidation process which forms an oxide region and a subsequent etching process to remove the oxide region thereby exposing the recessed portion of the semiconductor material, wherein the semiconductor material is silicon on insulator (SOI) material and the oxidation process forms the oxide region within the SOI material;
   forming at least one gate structure within the recessed portion of the semiconductor material; and
   forming channel regions for the at least one gate structure on both a recessed SOI region and a thicker SOI region, wherein the recessed SOI region is surrounded by the thicker SOI region which is protected during the oxidation process and the removing of the oxide region.

2. The method of claim 1, wherein the recessing of the semiconductor material includes thinning of the semiconductor material.

3. The method of claim 1, wherein:
   the oxidation process includes oxidizing an exposed portion of the semiconductor material to form the oxide region in the exposed portion of the semiconductor material; and
   the etching process includes removing the oxide region to form a thinned portion of the semiconductor material.

4. The method of claim 3, further comprising forming channel regions for the at least one gate structure on the thinned portion of the semiconductor material comprising the recessed portion and thicker portions of the semiconductor material comprising a non-recessed portion of the semiconductor material.

5. The method of claim 4, wherein the non-recessed portion completely surrounds the recessed portion.

6. The method of claim 4, wherein the at least one gate structure extends between the recessed portion of the semiconductor material and the non-recessed portion of the semiconductor material.

7. The method of claim 3, wherein the at least one gate structure is formed by deposition of a gate dielectric material on the thinned portion of the semiconductor material within the recessed portion and a deposition and patterning of gate material on the gate dielectric material.

8. The method of claim 2, further comprising protecting non-recessed portions of the semiconductor material from the oxidation process.

9. The method of claim 1, wherein the recessed portion is a thinned portion formed with a thickness less than surrounding portions of the semiconductor material.

10. The method of claim 9, wherein the thinned portion has a thickness of 300Å to 1000 Å.

11. The method of claim 1, wherein the at least one gate structure extends onto the thicker SOI region.

12. The method of claim 1, wherein the recessed portion undergoes a dopant implant process to form a well implant.

13. A method, comprising:
   exposing a surface of a silicon on insulator (SOI) material;
   performing an oxidation process on the exposed surface of the SOI material to form an oxide region within the SOI material;
   removing the oxide region to form a thinned SOI region of the SOI material;
   forming a gate structure on the thinned SOI region of the SOI material; and
   forming channel regions for the gate structure, on both the thinned SOI region and a thicker SOI region,
   wherein the thinned SOI region is surrounded by the thicker SOI region which is protected during the oxidation process and the removing of the oxide region, and the gate structure extends onto the thicker SOI region.

14. The method of claim 13, wherein the exposing the surface of the SOI material comprises etching a masking layer and underlying insulator layer, formed above the SOI material.

15. The method of claim 13, wherein a body contact region is formed on the thicker SOI region.

16. The method of claim 13, wherein the thinned SOI region is less than about 1000 Å in thickness 1000 A.

17. The method of claim 16, wherein the thinned SOI region is about 300 Å in thickness.

* * * * *